(12) United States Patent
Lin

(10) Patent No.: US 9,331,647 B2
(45) Date of Patent: May 3, 2016

(54) LOW-VOLTAGE AMPLIFIER AND METHOD THEREOF

(71) Applicant: Realtek Semiconductor Corp., Hsinchu (TW)

(72) Inventor: Chia-Liang (Leon) Lin, Fremont, CA (US)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 120 days.

(21) Appl. No.: 14/250,404

(22) Filed: Apr. 11, 2014

(65) Prior Publication Data

US 2015/0295538 A1 Oct. 15, 2015

(51) Int. Cl.
*H03F 3/45* (2006.01)

(52) U.S. Cl.
CPC .. *H03F 3/45183* (2013.01); *H03F 2203/45032* (2013.01); *H03F 2203/45112* (2013.01); *H03F 2203/45182* (2013.01)

(58) Field of Classification Search
CPC .......................................................... H03F 3/45
USPC .......................................... 330/253, 257, 261
See application file for complete search history.

(56) References Cited

U.S. PATENT DOCUMENTS

| | | | | |
|---|---|---|---|---|
| 8,680,922 B2* | 3/2014 | Wan | ...................... | H03F 1/0205 330/253 |
| 8,736,370 B2* | 5/2014 | Chiu | .................... | H03G 1/0029 330/253 |
| 8,791,758 B1* | 7/2014 | Foroudi | .................... | H03F 3/45 330/252 |
| 8,928,408 B2* | 1/2015 | Zanchi | .................... | H03F 3/005 330/253 |

\* cited by examiner

*Primary Examiner* — Henry Choe
(74) *Attorney, Agent, or Firm* — McClure, Qualey & Rodack, LLP

(57) ABSTRACT

An amplifier is provided having a first mixed-length MOS device set for receiving an input signal and outputting an output signal, and a first load for providing termination for the output signal, wherein the first mixed-length MOS device set comprises a parallel connection of a plurality of MOS devices having different channel lengths including at least a short channel length MOS device and a long channel length MOS device. In one configuration, a threshold voltage of the short channel length MOS device is greater than a threshold voltage of the long channel length MOS device. A related method is also provided.

12 Claims, 4 Drawing Sheets

LOW-VOLTAGE AMPLIFIER AND METHOD THEREOF

BACKGROUND OF THE INVENTION

1. Field of the Invention

The present invention relates to amplifiers and more particularly to amplifiers having improved performance and reliability over a wide range of supply voltages.

2. Description of Related Art

Persons of ordinary skill in the art will understand terms used in this application. For example, terms like MOS (metal-oxide semiconductor) transistor, "gate," "source," "drain," "channel length," "threshold voltage," "saturation region," and "triode region," as used in connection with a MOS transistor, and basic concepts for electronic circuits, such as: "voltage," "current," "trans-conductance," "output resistance," "biasing," "self-biasing," "single-ended," "differential," "pseudo-differential," "common-mode," "common-source," "common-gate," "cascade," and "cascode" will be readily understood. Terms like these are readily apparent from prior art documents like text books, e.g. "Design of Analog CMOS Integrated Circuits" by Behzad Razavi, McGraw-Hill (ISBN 0-07-118839-8).

As depicted in FIG. 1, a prior art differential amplifier 100 comprises: a current source 110 comprising NMOS (n-channel metal-oxide semiconductor transistor) 111 and 112 for outputting biasing currents I1 and I2 in accordance with a biasing voltage VB; a differential pair 120 comprising NMOS 121 and 122 for receiving biasing currents I1 and I2, so as to amplify a differential input signal VI (which comprises two ends VI+ and VI) into a differential output signal VO (which comprises two ends VO+ and VO); and a load comprising resistors 131 and 132 for providing termination for the differential output signal VO. Throughout this disclosure, VDD denotes a power supply voltage. Differential amplifier 100 is well known in prior art and thus not described in detail here. Barring a device mismatch due to finite tolerance in a manufacturing process, it is assumed that the differential amplifier 100 is symmetrical; that is, NMOS 111 and 112 are substantially the same, NMOS 121 and 122 are substantially the same, and resistors 131 and 132 are substantially the same. When using an advanced CMOS (complementary metal oxide semiconductor) process to manufacture differential amplifier 100, there is an issue that needs to be addressed. The supply voltage VDD is low, for instance 1V for a typical 28 nm CMOS process. Also, it is highly desirable, if not mandatory, that the differential input signal VI and the differential output signal VO are of the same common-mode value (i.e., (VI++VI)/2=(VO++VO)/2), so that a plurality of differential amplifiers of the same circuits can be easily cascaded. To fulfill effective amplification, NMOS transistors 121 and 122 of the differential pair 120 must be biased in the saturation region. To be biased in the saturation region, the static gate-to-source voltage (of NMOS transistors 121 and 122) must be greater than the threshold voltage (of NMOS transistors 121 and 122); therefore, the static voltage drop, which is the drain-to-source voltage (of NMOS transistors 121 and 122), also must be greater than the threshold voltage (of NMOS transistors 121 and 122). Also, for the current source 110 to have high output resistance that is highly desirable, NMOS transistors 111 and 112 also must operate in the saturation region where the voltage drop (between drain and source) cannot be too small, or else NMOS 111 and 112 might enter the triode region where output resistance cannot be very high.

On the other hand, the available swing for the differential output signal VO is determined by the voltage drop on the load devices (i.e., resistors 131 and 132). The total sum of the voltage drops across the load 130, differential pair 120, and the current source 110, however, is equal to the supply voltage VDD; if the voltage drop on the differential pair 120 is increased, the voltage drop allowed for the load 130 must be reduced, assuming the voltage drop for the current source 110 cannot be squeezed or else NMOS 111 and 112 might enter the triode region. For a typical 28 nm CMOS process, the threshold voltage of a MOS transistor depends on the channel length of the MOS transistor; a shorter channel MOS transistor allows a higher trans-conductance and thus a higher operation speed but unfortunately also has a higher threshold voltage. Due to the higher threshold voltage, the voltage drop across the differential pair 120 is greater, leaving less available swing for the differential output signal VO. Therefore, there is a trade-off between speed and available swing. Also, in an application circuit, the supply voltage VDD is subject to variation.

While a differential amplifier may function sufficiently well under a normal supply voltage, the performance may quickly degrade and even become dysfunctional in an over-stressed condition when the supply voltage drops to a certain low level. To ensure that the differential amplifier 100 remains functional under the lowest supply voltage that can be anticipated in an over-stressed condition, circuit designers are forced to use a longer channel length at the cost of reduced speed and performance at normal supply voltage.

BRIEF SUMMARY OF THIS INVENTION

An objective of this present invention is to enable an amplifier to have high performance in a normal power supply condition while remaining adequately functional in an over-stressed low-voltage condition.

Another objective of the present invention is to allow circuit designers to have a higher degree of freedom in circuit optimization so as to achieve a better overall performance over a wide range of supply voltage.

Another objective of this present invention is to establish a bias voltage that is reliable over a wide range of supply voltage.

In an embodiment, an amplifier comprises: a first mixed-length MOS device set for receiving an input signal and outputting an output signal, and a first load for providing termination for the output signal, wherein the first mixed-length MOS device set comprises a parallel connection of a plurality of MOS devices having different channel lengths including at least a short channel length MOS device and a long channel length MOS device. In an embodiment, a threshold voltage of the short channel length MOS device is greater than a threshold voltage of the long channel length MOS device.

In an embodiment, the amplifier further comprises a current source biased by a biasing voltage for providing a biasing current for the first mixed-length MOS device set. In an embodiment, the amplifier further comprises a biasing network for generating the biasing voltage, wherein: the biasing network comprises a cascode current mirror comprising a reference branch and a mirror branch; the reference branch comprises a reference MOS device and a first cascode device comprising a second mixed-length MOS device set; the mirror branch comprises a mirror MOS device, a second cascode device comprising a third mixed-length MOS device set, and a second load; and a voltage at the second load is used as a self-biasing voltage for biasing both the first cascode device and the second cascode device.

In an embodiment, a method comprises: receiving a supply voltage; receiving an input signal; amplifying the input signal using an amplifier comprising a mixed-length MOS device set comprising a parallel combination of a plurality of MOS devices having different channel lengths; including a short channel MOS device in the mixed-length MOS device set to enable the amplifier to have a high speed in a normal power supply condition; and including a long channel MOS device in the mixed-length MOS device set to enable the amplifier to remain adequately functional in an over-stressed low power supply condition.

In a further embodiment, the method further comprises: establishing a bias voltage for the amplifier using a cascode current mirror comprising a reference branch and a mirror branch; using a mixed-length MOS device set as a cascode device for the reference branch; using a mixed-length MOS device set as a cascode device for the mirror branch; establishing a self-biasing voltage by incorporating a load circuit in the mirror branch; and using the self-biasing voltage to bias the cascode current mirror.

DETAILED DESCRIPTION OF THIS INVENTION

The present invention relates to amplifier. While the specifications described several example embodiments of the invention, it should be understood that the invention can be implemented in many ways and is not limited to the particular examples described below or to the particular manner in which any features of such examples are implemented. In other instances, well-known details are not shown or described to avoid obscuring aspects of the invention.

Figure 1:
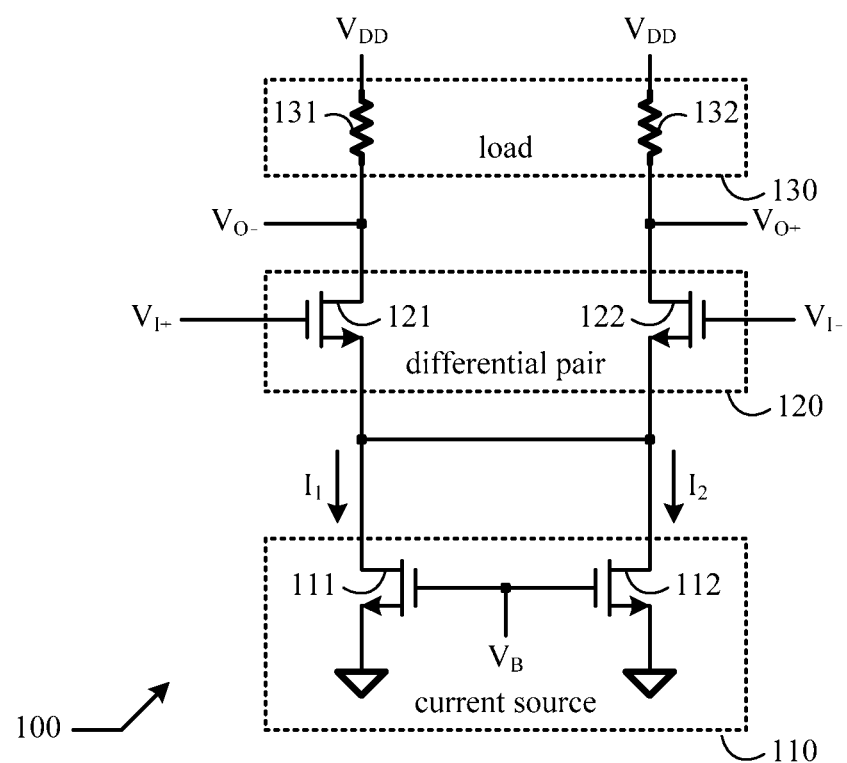
FIG. 1 shows a schematic diagram of a prior art differential amplifier.

As depicted in FIG. 1, a differential amplifier 200 in accordance with an embodiment of the present invention comprises: a current source 210 comprising a first NMOS transistor 211 and a second NMOS transistor 212 for outputting biasing currents I1 and I2, respectively, in accordance with a biasing voltage VB; a differential pair 220 comprising a first mixed-length device set 250 (comprising at least a long-channel device NMOS transistor 251 and a short channel device NMOS transistor 252) and a second mixed-length device set 260 (comprising at least a long channel device NMOS transistor 261 and a short channel device NMOS transistor 262) for receiving biasing currents I1 and I2 and amplifying a differential input signal VI (which comprises two ends VI+ and VI) into a differential output signal VO (which comprises two ends VO+ and VO); and a load circuit 230 comprising resistors 231 and 232 for providing termination for the differential output signal VO. Barring a device mismatch due to finite tolerance in a manufacturing process, it is assumed that the differential amplifier 200 is substantially symmetrical; that is, NMOS transistors 211 and 212 are substantially the same, the first mixed-length device set 250 and the second mixed-length device set 260 are substantially the same, and resistors 231 and 232 are substantially the same. Differential amplifier 200 of FIG. 1 differs from prior art differential amplifier 100 of FIG. 1 in at least the following respects: two mixed-length device sets (250 and 260), instead of two single-length devices (NMOS transistors 121 and 122), are used to form a differential pair for amplification. In this disclosure, a mixed-length device set is defined as a set of MOS devices (either p-channel or n-channel) comprising a plurality of MOS devices that include at least a long channel device and a short channel device, wherein said plurality of MOS devices are connected in parallel; that is, all the source terminals are tied together, all the gate terminals are tied together, and all the drain terminals are tied together. Here, the "long" and "short" are defined in a relative sense; that is, the long channel device is intentionally designed to be longer in channel length than the short channel device. The long channel length devices (e.g. NMOS transistors 251 and 261) have a smaller threshold voltage than the short channel length devices (e.g. NMOS transistors 252 and 262). In a normal operation, where the supply voltage VDD is typical and the voltage headroom is sufficient for the short channel devices, the short channel devices are more dominant, compared to the long channel devices, due to greater trans-conductance and thus higher speed; in an over-stressed condition where the supply voltage VDD drops to a low level where there is no sufficient headroom for the short channel devices to operate in the saturation region, the long channel devices take over and enable the differential amplifier 220 to remain adequately functional.

Figure 2:
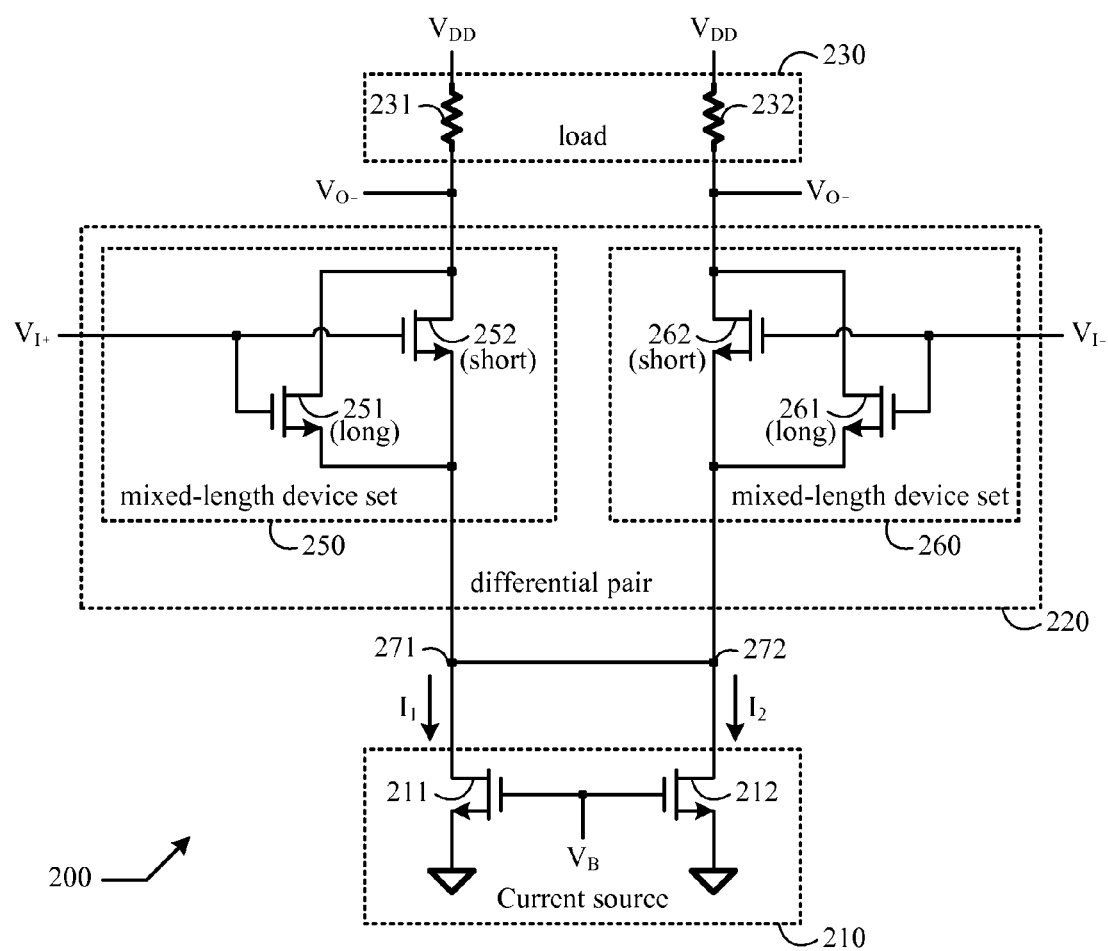
FIG. 2 shows a schematic diagram of a differential amplifier in accordance with an embodiment of the present invention.

Due to using a combination of MOS devices having different channel lengths, differential amplifier 200 of FIG. 2 can be designed to offer an overall better performance than prior art differential amplifier 100 of FIG. 1, due to a higher degree of freedom for design optimization that seeks to take advantage of different benefits that devices of different channel lengths can offer. In other words, by virtue of the higher degree of freedom due to using a mixed-length MOS device set, this present invention allows circuit designers to accomplish a better overall performance over a wide range of supply voltage. In an embodiment that is meant to be an example but not limitation: differential amplifier 200 is fabricated in a 28 nm CMOS process; VDD is approximately 1V in a typical condition and drops to approximately 0.9V in an over-stressed condition; I1 and I2 are both approximately 1 mA; resistors 231 and 232 are both approximately 300 Ohm; the long channel length devices (NMOS transistors 251 and 252) are approximately 8 μm in channel width and 80 nm in channel length and have a threshold voltage of approximately 400 mV; and the short channel length devices (e.g. NMOS transistors 261 and 262) are approximately 8 μm in channel width and 30 nm in channel length and have a threshold voltage of approximately 500 mV.

Figure 3:
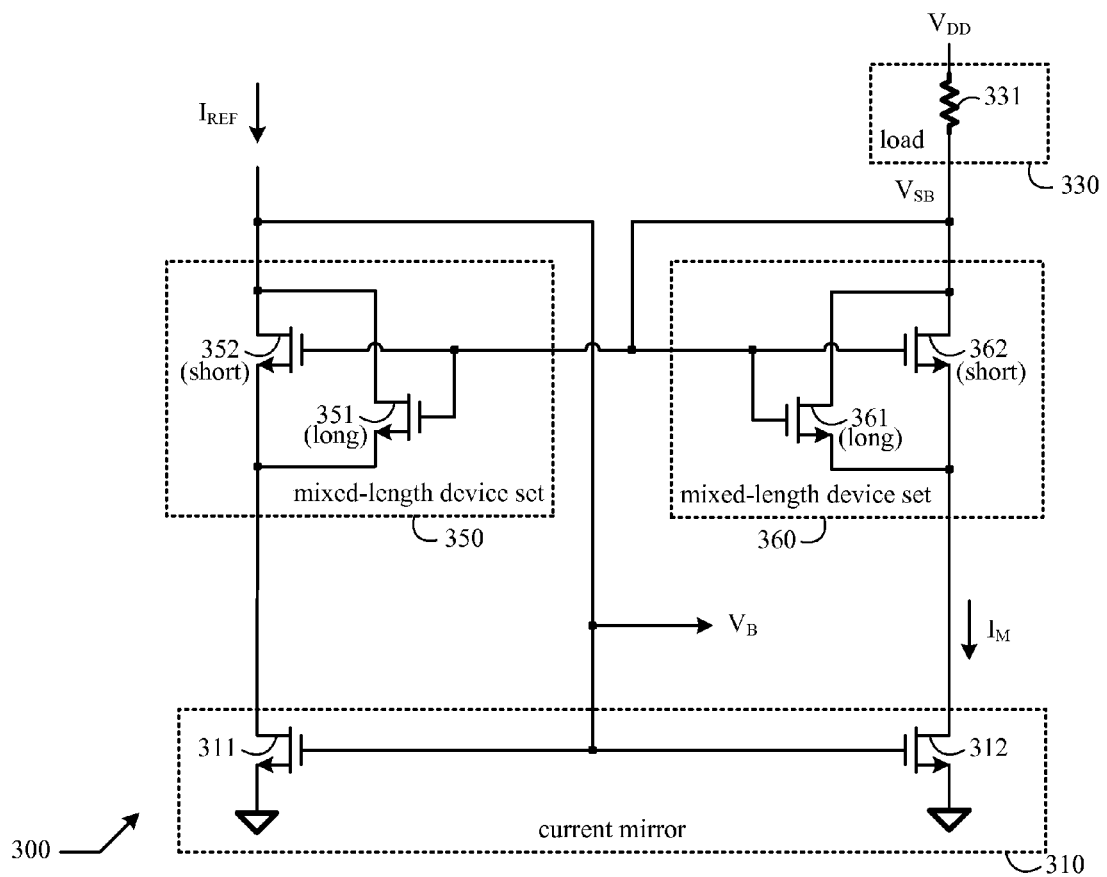
FIG. 3 shows a schematic diagram of a biasing network for the differential amplifier of FIG. 2.

A biasing network 300 suitable for generating the biasing voltage VB for differential amplifier 200 of FIG. 2 in accordance with an embodiment of the present invention is depicted in FIG. 3. Biasing network 300 receives a reference current IREF and converts it into the biasing voltage VB using a cascode current mirror topology comprising a reference branch and a mirror branch. Biasing network 300 comprises: a current mirror 310 comprising a reference NMOS 311 and a mirror NMOS 312 for receiving the reference current IREF and outputting a mirrored current IM; a load 330 comprising resistor 331 for providing a termination for the mirrored current IM to generate a self-biasing voltage VSB; a mixed-length device set (comprising at least a long channel device NMOS 351 and a short channel device 352) for serving as a cascode device for the reference NMOS 311 to form the reference branch; and another mixed-length device set (comprising at least a long channel device NMOS 361 and a short channel device 362) for reserving as a cascode device for the mirror NMOS 312 to form the mirror branch. Both the first mixed-length device set 350 and the second mixed-length device set 360 are biased using the self-biasing voltage VSB. Biasing network 300 is suitable for generating the biasing voltage VB for differential amplifier 200 of FIG. 2 due to that, the mirror branch of the biasing network 300, which is right half circuit (comprising the mirror NMOS 312 of the current mirror 310, the mixed-length device set 360, and resistor 331), mimics both the left half circuit (comprising NMOS transistor 211, mixed-length device set 250, and resistor 231) and the right half circuit (comprising NMOS transistor 212, mixed-length device set 260, and resistor 232) of the differential amplifier 200 of FIG. 2, therefore, the currents I1 and I2 in FIG. 2 can track well with the mirrored current IM of FIG. 3, which is mirrored from the reference current IREF. The accuracy of the current mirroring of the current mirror 310 is enhanced due to using the cascode topology that employs mixed-length device sets 350 and 360.

Now, referring again to FIG. 2. In an alternative embodiment not shown in the figure, a resistor may be inserted between node 271 and node 272 to provide a source degeneration for the differential pair 220. In another alternative embodiment, also not shown in the figure, a capacitor and a resistor in parallel are inserted between node 271 and node 272. In a yet alternative embodiment not shown in the figure, current source 210 is removed and node 271 and node 272 are both tied to ground; this is an embodiment of pseudo-differential topology. In a yet alternative embodiment not shown in figure, node 271 and node 272 are both tied to ground, and current source 210, mixed-length device set 260, and resistor 232 are all removed; this is an embodiment of single-ended topology.

Although differential amplifier 200 of FIG. 2 and biasing network 300 of FIG. 3 are both based on NMOS devices, it is known that, for a given circuit comprising a plurality of MOS devices along with passive devices such as resistors and capacitors, swapping the roles of PMOS and NMOS (i.e., replacing every NMOS in the given circuit with a PMOS, and replacing every PMOS in the given circuit with a NMOS), and also swapping the roles of the supply voltage and the ground (i.e., changing every VDD in the given circuit to ground, and changing every ground in the given circuit to VDD) may result in a "flipped" circuit that has the same function as the original circuit.

Although differential amplifier 200 of FIG. 2 is based on "common-source" amplifier topology, embodiments of the present invention can be applied to "common-gate" amplifier topology as well, as the benefits of using a mixed-length MOS device set to allow a higher degree of freedom for design optimization are preserved. In an alternative embodiment not shown in the figure, differential amplifier 200 of FIG. 2 is modified to a "common-gate" amplifier by doing the following changes: break the connection between node 271 and node 272; tie the gates of the first mixed-length device set 250 and the second mixed-length device set 260 to another biasing voltage; couple VI+ and VI− to nodes 271 and 272, respectively.

Figure 4:
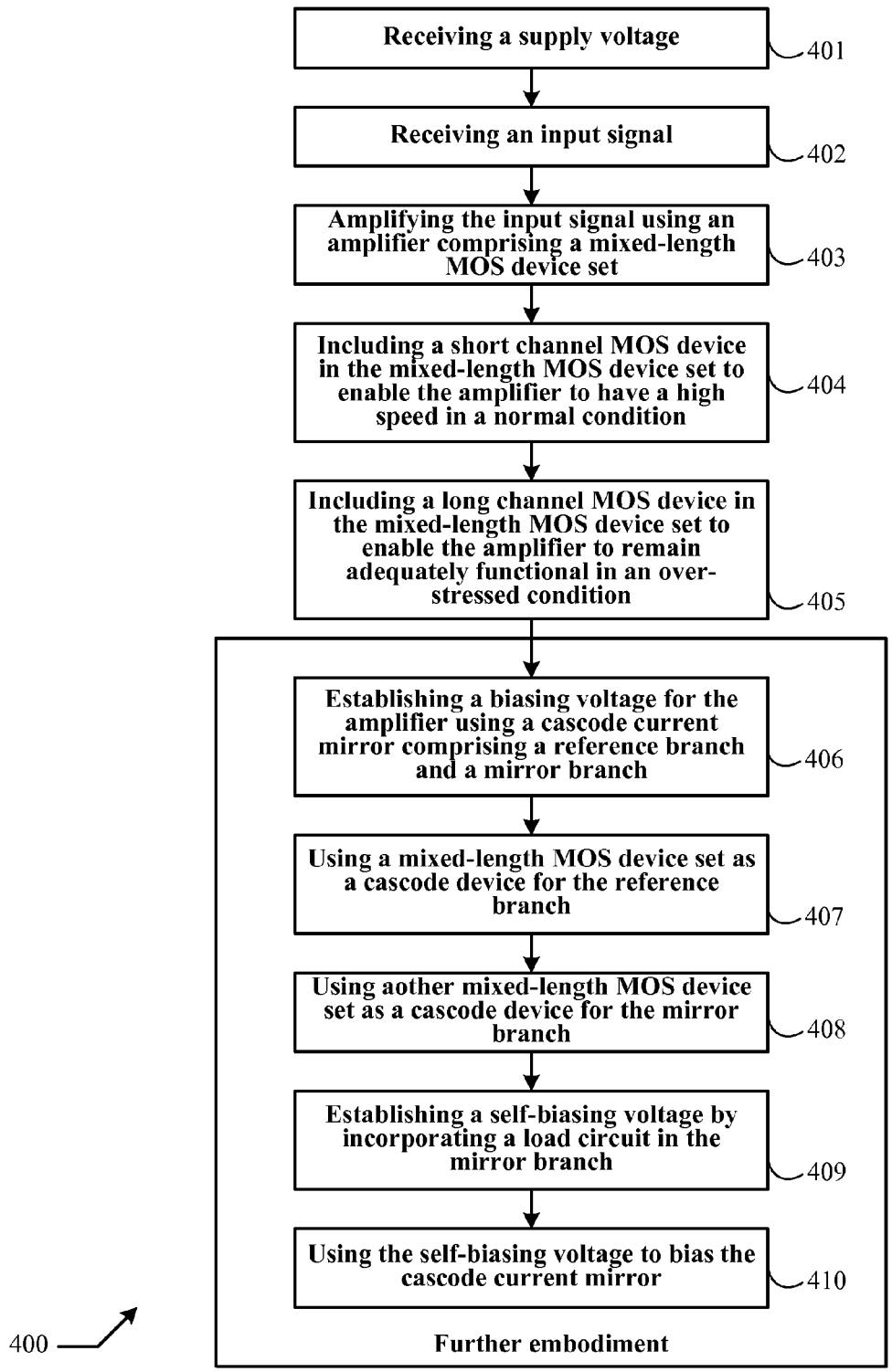
FIG. 4 shows a flow diagram of methods in accordance with embodiments of the present invention.

In an embodiment illustrated by flow diagram 400 depicted in FIG. 4, a method comprises: step 401 for receiving a supply voltage; step 402 for receiving an input signal; step 403 for amplifying the input signal using an amplifier comprising a mixed-length MOS device set; step 404 for including a short channel MOS device in the mixed-length MOS device set to enable the amplifier to have a high speed in a normal condition; step 405 for including a long channel MOS device in the mixed-length MOS device set to enable the amplifier to remain adequately functional in an over-stressed condition. In a further embodiment, the method further comprises: step 406 for establishing a bias voltage for the amplifier using a cascode current mirror comprising a reference branch and a mirror branch; step 407 for using a mixed-length MOS device set as a cascode device for the reference branch; step 408 for using a mixed-length MOS device set as a cascode device for the mirror branch; step 409 for establishing a self-biasing voltage by incorporating a load circuit in the mirror branch; and step 410 for using the self-biasing voltage to bias the cascode current mirror.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An amplifier comprising:
    a first mixed-length MOS (metal-oxide semiconductor) device set for receiving an input signal and outputting an output signal; and
    a first load for providing termination for the output signal, wherein the first mixed-length MOS device set comprises a parallel connection of a plurality of MOS devices having different channel lengths including at least a short channel length MOS device and a long channel length MOS device, wherein the channel length of the long channel length MOS device is longer than the channel length of the short channel length MOS device, wherein the plurality of MOS devices includes a first MOS transistor and a second MOS transistor, and the parallel connection is defined by a source terminal of the first MOS transistor being directly connected to a source terminal of the second MOS transistor and a drain terminal of the first MOS transistor being directly connected to a drain terminal of the second MOS transistor.

2. The amplifier of claim 1, wherein a threshold voltage of the short channel length MOS device is higher than a threshold voltage of the long channel length MOS device.

3. The amplifier of claim 1, wherein a performance of the amplifier under a normal power supply condition is dominated by the short channel length MOS device.

4. The amplifier of claim 1, wherein a performance of the amplifier under an over-stressed low power supply condition is dominated by the long channel length MOS device.

5. The amplifier of claim 1 further comprising a current source biased by a biasing voltage for providing a biasing current for the first mixed-length MOS device set.

6. The amplifier of claim 5 further comprising a biasing network for establishing the biasing voltage.

7. The amplifier of claim 6, wherein the biasing network comprises a cascode current mirror comprising a reference branch and a mirror branch.

8. The amplifier of claim 7, wherein the reference branch comprises a reference MOS device and a first cascode device comprising a second mixed-length MOS device set;
    the mirror branch comprises a mirror MOS device, a second cascode device comprising a third mixed-length MOS device set, and a second load; and
    a voltage at the second load is used as a self-biasing voltage for biasing both the first cascode device and the second cascode device.

9. The amplifier of claim 1, wherein the channel length of the long channel length MOS device is approximately 80 nm, and the channel length of the short channel length MOS device is approximately 30 nm.

10. A method comprising:
receiving a supply voltage; receiving an input signal;
amplifying the input signal using an amplifier comprising a mixed-length MOS device set comprising a parallel combination of a plurality of MOS devices having different channel lengths, wherein the plurality of MOS devices includes a first MOS transistor and a second MOS transistor, and the parallel combination is defined by a source terminal of the first MOS transistor being directly connected to a source terminal of the second MOS transistor and a drain terminal of the first MOS transistor being directly connected to a drain terminal of the second MOS transistor;
including a short channel MOS device in the mixed-length MOS device set to enable the amplifier to have a high speed in a normal power supply condition; and including a long channel MOS device in the mixed-length MOS device set to enable the amplifier to remain adequately functional in an over-stressed low power supply condition.

11. The method of claim 10 further comprising:
establishing a biasing voltage for the amplifier using a cascode current mirror comprising a reference branch and a mirror branch; using a mixed-length MOS device set as a cascode device for the reference branch;
using another mixed-length MOS device set as a cascode device for the mirror branch;
establishing a self-biasing voltage by incorporating a load circuit in the mirror branch; and
using the self-biasing voltage to bias the cascode current mirror.

12. A method comprising:
receiving a supply voltage; receiving an input signal;
amplifying the input signal using an amplifier comprising a mixed-length MOS device set comprising a parallel combination of a plurality of MOS devices having different channel lengths;
including a short channel MOS device in the mixed-length MOS device set to enable the amplifier to have a high speed in a normal power supply condition;
including a long channel MOS device in the mixed-length MOS device set to enable the amplifier to remain adequately functional in an over-stressed low power supply condition;
establishing a biasing voltage for the amplifier using a cascode current mirror comprising a reference branch and a mirror branch; using a mixed-length MOS device set as a cascode device for the reference branch;
using another mixed-length MOS device set as a cascode device for the mirror branch;
establishing a self-biasing voltage by incorporating a load circuit in the mirror branch; and
using the self-biasing voltage to bias the cascode current mirror.

* * * * *